United States Patent
Louis et al.

[19]

[11] Patent Number: 6,031,297
[45] Date of Patent: Feb. 29, 2000

[54] PRINTED CIRCUIT BOARD ALLOWING USAGE OF ALTERNATIVE PIN-COMPATIBLE MODULES

[75] Inventors: Philippe Louis, Nice; Michel Verhaeghe, Vence, both of France

[73] Assignee: International Business Machines Corporation, Armonk, N.Y.

[21] Appl. No.: 09/161,931

[22] Filed: Sep. 28, 1998

[30] Foreign Application Priority Data

Jan. 22, 1998 [EP] European Pat. Off. ............. 98480003

[51] Int. Cl.[7] ....................................... H02J 1/00
[52] U.S. Cl. .............................. 307/43; 307/80; 307/150
[58] Field of Search ................................. 307/43, 69, 77, 307/80, 85, 86, 112, 116, 125, 150, 151; 361/748, 760, 784, 792, 794, 816

[56] References Cited

U.S. PATENT DOCUMENTS

| | | | |
|---|---|---|---|
| 5,488,540 | 1/1996 | Hatta | 361/794 |
| 5,497,037 | 3/1996 | Lee et al. | 307/42 |
| 5,587,887 | 12/1996 | Price et al. | 361/794 |
| 5,616,967 | 4/1997 | Lee et al. | 307/42 |
| 5,682,298 | 10/1997 | Raynham | 361/794 |
| 5,736,796 | 4/1998 | Price et al. | 307/151 |
| 5,847,451 | 12/1998 | Ohtaki et al. | 257/697 |

*Primary Examiner*—Jeffrey Gaffin
*Assistant Examiner*—Peter Zura
*Attorney, Agent, or Firm*—Joscelyn G. Cockburn

[57] ABSTRACT

Printed circuit board comprising two power supplies $V_1$ and $V_2$ and a ground (GND), and a plurality of modules among which at least one module supplied by one of the power supplies can be replaced by another pin-compatible module supplied by the other power supply, each power supply being supplied in each case by a circuit including a ferrite connected to the power supply and a capacitor connected to the ground in order to filter the high frequency signals due to the switching operations in the modules. The board comprises a first area (24 or 24') having a first and a second terminals which is dedicated to a first ferrite to be connected to one power supply by means of its first terminal, and a second area (26 or 26') having a first and a second terminals and being dedicated to a second ferrite to be connected to the other power supply by means of its first terminal, each area including a connecting means for connecting the second terminal associated with the area to the footprints of the module.

23 Claims, 2 Drawing Sheets

PRINTED CIRCUIT BOARD ALLOWING USAGE OF ALTERNATIVE PIN-COMPATIBLE MODULES

TECHNICAL FIELD

The present invention relates to printed circuits boards comprising two power supplies and suitable for installing thereto either a module powered by one of the power supplies or a module powered by the other source.

BACKGROUND

Most of printed circuit boards available today are powered by two power supplies, whose voltage is respectively 5 volts and 3.3 volts. This is because some high density modules to be installed on the board require a voltage of 5 volts while other high density modules require 3.3 volts.

However, interchangeable modules are available to perform the same functions. Namely, when mounting the modules on the board, a 5-volt module can be replaced with another component requiring a 3.3-volt power supply. In such a case, both modules are pin-compatible, which means that they have the same contacts or footprints, so that the first module can easily be replaced with the second one with no need to modify the board.

Unfortunately, since the power supply is not the same for both modules, the connection of the second module footprints to the power supply is different from the connection of the first module footprints to the other power supply. Two solutions are then possible if using two boards is unwanted. The first solution consists in connecting by means of straps at the time of mounting, the module footprints to the vias that link the suitable power supply of the board. In the second solution, the board is already provided with connecting tracks with two vias, each via being connected to one distinct power supply. In the latter case, it is thus necessary to scrape off one connecting track. In both cases, the tasks are tedious and expensive when there are many footprints (for example 16 footprints).

SUMMARY OF THE INVENTION

This is why the object of the invention is to provide a printed circuit board comprising at least an interchangeable module designed so that the module powered by a first power supply can be replaced with another pin-compatible module powered by a second power supply.

Accordingly, the invention relates to a printed circuit board comprising two power supplies $V_1$ and $V_2$ and a ground, and a plurality of modules among which at least one module supplied with power by one power supply can be replaced by another pin-compatible module supplied with power by the other power supply, each power supply being connected in each case by a circuit including a ferrite and a capacitor connected to the ground in order to filter the high frequency signals due to the switching operations in the modules. The board comprises a first area having a first and a second terminals which is dedicated to a first ferrite to be connected to one power supply by means of the first terminal, and a second area having a first and a second terminals which is dedicated to a second ferrite to be connected to the other power supply, each of the first and second areas including connecting means for connecting the second terminal associated with the area to the footprints of the module.

BRIEF DESCRIPTION OF THE DRAWINGS

The objects, features and other characteristics of the invention will become more apparent from the following detailed description with reference to the accompanying drawings, in which.

DETAILED DESCRIPTION OF THE INVENTION

When the modules are directly connected to the power supplies, the power voltage comprises high frequency signals that can reach 100 MHZ, due to switching noises when the module is operating. This is why the module footprints are connected to the power supply by means of a decoupling circuit shown on FIG. 1.

The power supply Vcc (5 volts or 3.3 volts) is connected to the point whose voltage is Vx through an inductance 10 and a capacitor 12 linked to the ground. The inductance 10 is actually a ferrite with a value of a few AH and the value of the capacitor 12 is about 100 nF. This way, more than 99.9% of high frequency signals are driven to the ground, and the voltage value Vx that provides the power supply to footprints 14 is stable.

Figure 1:
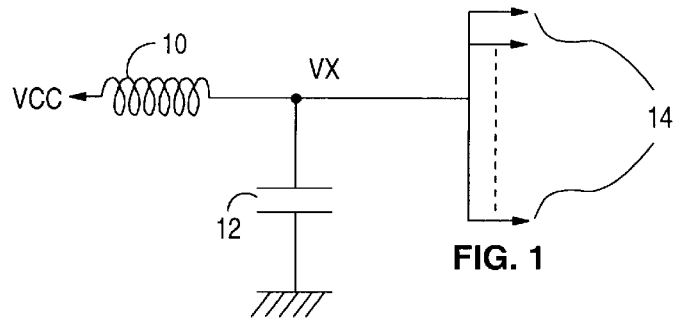
FIG. 1 shows schematically the circuit used to connect the module footprints to the power supply.
Figure 2:
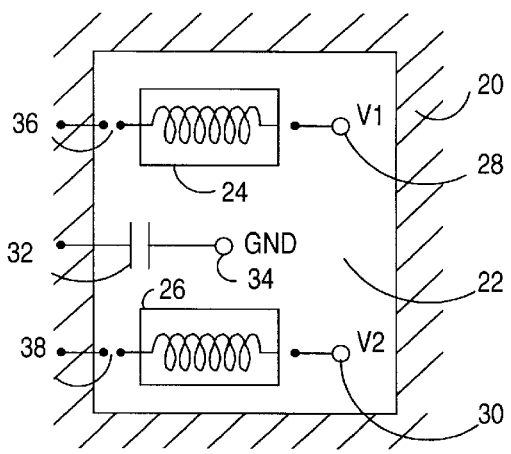
FIG. 2 shows schematically the circuits that connect the two power supplies when supply pins are arranged at the periphery in a first embodiment of the invention.
Figure 3:
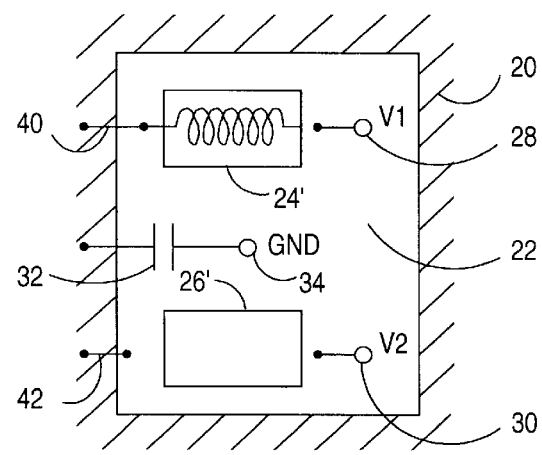
FIG. 3 shows schematically the circuits that connect the two power supplies on a board provided with supply pins arranged at the periphery in a second embodiment of the invention.

The invention is thus implemented as follows. When supply pins are located at the periphery as shown in FIGS. 2 and 3, the footprint connection vias lead to a peripheral copper plate 20 located on the lower side of the board. In the case of a module with 16 power supply footprints, 16 vias lead to the plate 20. This copper plate 20 surrounds a hollow zone 22 on which are located two ferrite areas 24 and 26. The two areas are connected respectively to a via 28 supplying the first power supply $V_1$ (for example 5 volts) and a via 30 supplying the second power supply $V_2$ (for example 3.3 volts). A capacitor 32 corresponding to the capacitor 12 from FIG. 1 is connected to a via 34 that provides the ground. The other terminal of the capacitor 32 is connected to the copper plate 20.

In a first embodiment shown on FIG. 2, each ferrite area is provided with a ferrite and is connected to the copper plate by a connection comprising at the beginning an open part 36 or 38. During the manufacturing process of the board, depending on whether the module being installed requires a 5-volt or a 3.3-volt power supply, the proper connection is performed by means of a strap (or another connecting means). This way, the copper plate 20 to which are connected the vias corresponding to the module footprints, is powered by a voltage $V_1$ or $V_2$ filtered through the circuit made up of the ferrite located on one of the two areas 24 and 26 and to the capacitor 32 connected to the ground. If one wishes later to replace the installed module with another pin-compatible module that requires the other power supply, the only thing to do is scraping off the connection 36 (or 38) and establishing the other connection 38 (or 36).

In a second embodiment shown in FIG. 3, only one of the two areas 24' or 26' comprises a ferrite and the connections 40 and 42 between the areas and the copper plate 20 are established at the very start. This way, when manufacturing the board, it is easy to place a ferrite in the selected area corresponding to the power supply $V_1$ or $V_2$ required to power the module installed on the board. If one wishes later to replace the installed module with another pin-compatible module powered by the other power supply, the only thing to do is removing the ferrite from its area and to put it into the second area.

Figure 4:
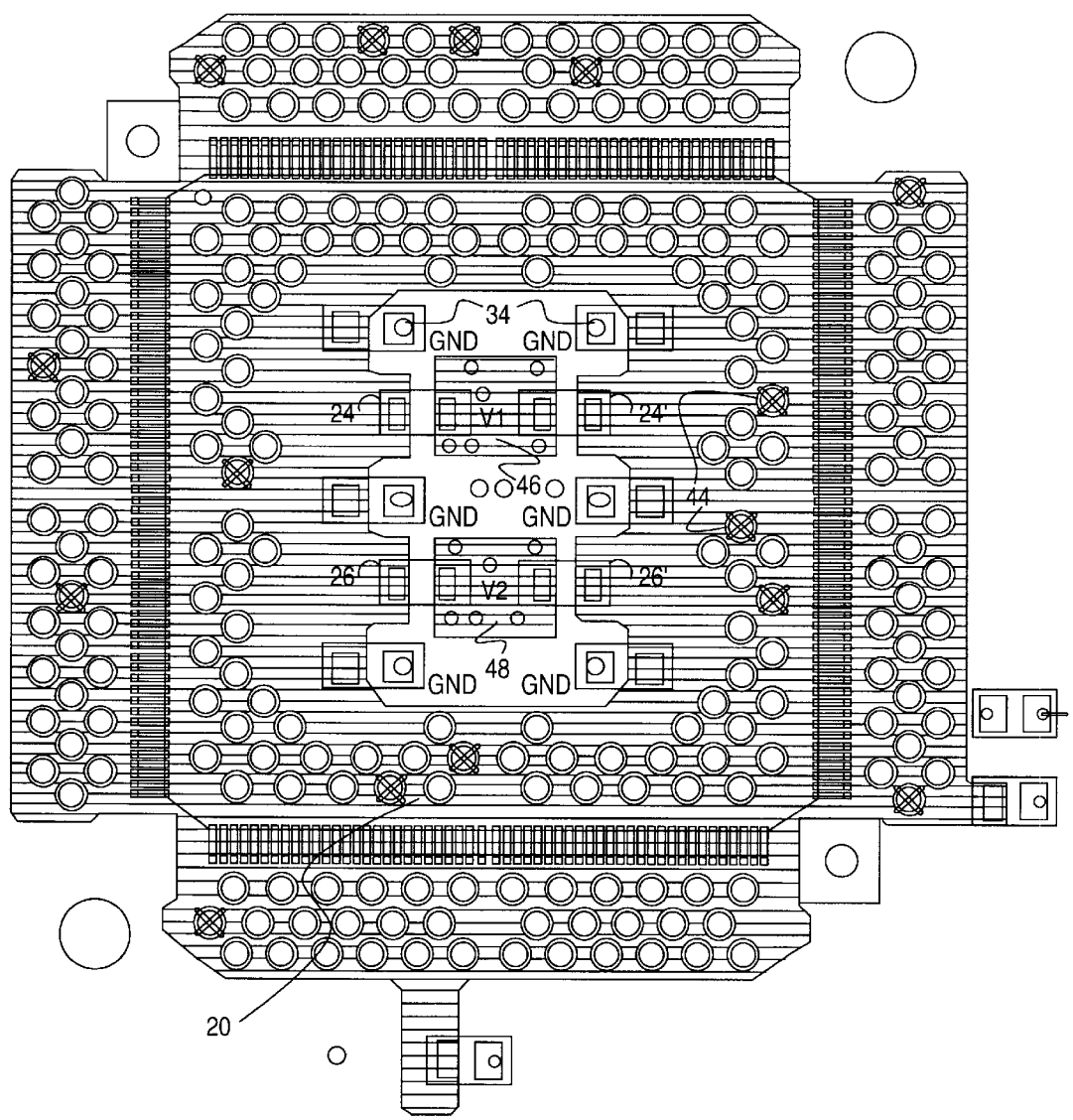
FIG. 4 shows the topography of a board using supply pins arranged at the periphery and on which is mounted a module provided with connections according to the second embodiment of the invention.

Practically, the second embodiment is produced as shown on the FIG. 4 on which one can see the lower part of the board on which the module is installed. The vias that connect the copper plate 20 to the module footprints are those marked by a St Andrew/Es cross, such as vias 44. It is to be noted that, for reliability reasons, the circuits shown on the FIG. 3 are doubled, tripled or even more. This way, there are 6 capacitor areas and 6 vias connected to the ground such as via 34. In the same way, the ferrite areas have been doubled. Thus, we have 2 areas 24 and 24' for connecting the power supply $V_1$ and 2 areas 26 and 26' for connecting the power supply $V_2$. It is to be noted that the power supply $V_1$ is connected to a copper plate 46 by means of many vias and the power supply $V_2$ is also connected to a copper plate 48 by means of many vias for reliability reasons.

Figure 5:
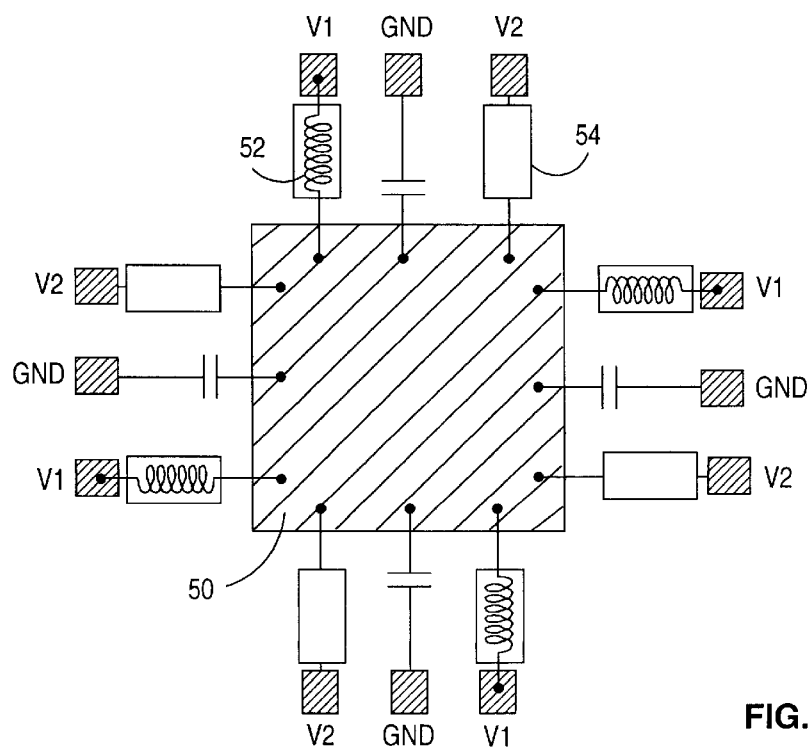
FIG. 5 shows schematically the circuits that connect the two power supplies on a board provided with supply pins located in the central region.

The invention can also be implemented with boards for which supply pins are located in the central region, as for Pin Grid Array (PGA) or Ball Grid Array (BGA). In such a case shown schematically on FIG. 5, all the vias that connect the module footprints lead to a central copper plate 50. Ferrites have been installed in the four areas such as area 52, connected to the power supply $V_1$ (all circuits have been quadrupled for safety reasons). On the other hand, the four areas such as the area 54, connected to the power supply $V_2$ do not comprise ferrite. Finally, the copper plate 50 is connected to the ground (GND) through four capacitors.

Although the invention has been described above with two power supplies, it is obvious for the skilled man that it is applicable to a printed circuit board having at least one interchangeable module being supplied by a power supply amongst three or more voltages such as 5 volts, 3.3 volts, 2.5 volts.

While the invention has been described in terms of preferred embodiments, those skilled in the art will recognize that the invention can be practiced with modification within the spirit and scope of the appended claims.

Having thus described our invention, what we claim is as follows:

We claim:

1. A printed circuit board including at least two power supplies attachment points; a ground terminal;
   a plurality of modules wherein at least one of the modules, supplied with power from one of the two power supplies attachment points, can be replaced by another module suppled with power from another of the two power supplies attachment points;
   a first area having a first terminal and a second terminal,
   a first ferrite member disposed in said first area and coupled by the first terminal to one of the at least two power supplies attachment points;
   a second area having a third terminal and a fourth terminal;
   a second ferrite member disposed within said second area and coupled by the third terminal to another of the at least two power supplies attachment points; and
   a connecting point on each of the second terminal and the fourth terminal for coupling the first area or the second area to the at least one of the modules or the another module.

2. The printed circuit board of claim 1 wherein only one of the first area and the second area is fitted with a ferrite member.

3. The printed circuit board of claim 1 or 2 further including a conductive plate;
   a first conductive member and a second conductive member connecting the connecting point on each of the second terminal and the fourth terminal, respectively, to the conductive plate.

4. The printed circuit board of claim 3 further including a GND attachment point; a filtering circuitry; a third conductive member connecting the filtering circuitry to the GND attachment point and a fourth conductive member coupling the filtering circuitry to a conductive plate.

5. The printed circuit board of claim 3 wherein the filtering circuit includes a capacitor.

6. A printed circuit board for mounting a plurality of modules, wherein said printed circuit board includes at least one location whereat at least two separate sources of power are being supplied, said at least one location including:
   a first outlet for connecting to one of the at least two separate sources of power;
   a second outlet for connecting to another of the at least two different separate sources of power;
   a third outlet for connecting to a reference voltage level;
   a capacitor coupling the reference voltage level to a third voltage level;
   a first area fabricated on said circuit board;
   said first area having a first terminal coupled to the first outlet or the second outlet and a second terminal; and
   a second area operatively disposed on said printed circuit board;
   said second area having a third terminal coupled to the first outlet or the second outlet and a fourth terminal.

7. The printed circuit board of claim 6 further including an inductive device positioned within one of the first area or the second area; and a strap operatively connected to a connecting point associated with the first area or the second area in which said inductive device is placed and the second terminal or fourth terminal, respectively, wherein power is provided to said connecting point.

8. The printed circuit board of claim 7 wherein the inductive device includes a ferrite member.

9. The printed circuit board of claim 6 wherein the second terminal and the fourth terminal are coupled to the third voltage level.

10. The printed circuit board of claim 9 including an inductor operatively mounted in one of the first area or the second area.

11. The printed circuit board of claim 6 further including a first connecting point and a second connecting point positioned in spaced relationship to the second terminal and the fourth terminal, respectively, and a first conductor and a second conductor connecting the first connecting point and the second connecting point, respectively, to the third voltage level.

12. Printed circuit board comprising:
    a conductive plate fabricated on said board;
    a location on said circuit board that can be populated with a first module or a second module requiring electrical power from a first or second power source, respectively;

at least one vias connection between the conductive plate and the location;

at least first conductive path and second conductive path for connecting to the first power source and the second power source, respectively, fabricated on said board;

a first area having a first terminal and a second terminal coupled to the at least first or second conductive path; and a second area having a fourth terminal and a third terminal coupled to the at least first or second conductive path.

13. The printed circuit board of claim 12 further including a reference voltage level; and a capacitor coupling the reference voltage level to the conductive plate.

14. Printed circuit board according to claim 13, wherein said first and second areas and said capacitor are duplicated several times.

15. The printed circuit board of claim 12 wherein the conductive plate includes copper.

16. Printed circuit board according to claim 15, wherein said first and fourth terminals associated with first and second areas respectively, are connected in the conductive plate, and a ferrite member is installed in only one of said first and second areas in order to feed a module footprint mounted in said location with the power from a power source providing power to said area.

17. Printed circuit board according to claim 16, wherein said footprints of said module are all connected by vias to the conductive plate surrounding a hollow zone on which are located said first and second areas.

18. Printed circuit board according to claim 16, wherein said footprints of said module are all connected by Vias to the copper plate surrounded by a periphery on which said first and second areas are connected.

19. Printed circuit board according to claim 12, wherein a ferrite member is installed in each of said first and second areas and only one of said first or fourth terminals corresponding to one of the first or second power sources, respectively, is coupled to the conductive plate in order to feed a module footprint positioned in said location with power.

20. Printed circuit board according to claim 12, wherein the first and second power sources are respectively 5 volts and 3.3 volts.

21. A method for building a printed circuit board comprising the steps of:

mounting a plurality of modules at different sites on said printed circuit board;

leaving unpopulated at least one site whereat modules requiring power from different power supply sources can be mounted;

providing at least two power supply attachment points on said printed circuit board;

providing, at the unpopulated site, a first outlet for connecting to one of the at least two power supply attachment points;

providing, at the unpopulated site, a second outlet for connecting to another of the at least two power supply attachment points;

providing, at the unpopulated site, a third outlet for connecting to a reference voltage level;

providing a capacitor coupling the reference voltage level to a third voltage level;

providing a first area for supporting a first ferrite member; said first area having a first terminal coupled to the first outlet or the second outlet and a second terminal; and a second area for supporting a second ferrite member, said second area having a third terminal coupled to the first outlet or the second outlet and a fourth terminal.

22. The method of claim 21 further including the step of interconnecting the fourth terminal, the third voltage level and the second terminal with a conductive member.

23. The method of claim 22 further including the step of operatively mounting a ferrite rod in one of the first area or second area.

* * * * *